United States Patent [19]

Watsuji et al.

[11] Patent Number: 5,654,920

[45] Date of Patent: *Aug. 5, 1997

[54] NONVOLATILE SEMICONDUCTOR STORAGE SYSTEM

[75] Inventors: Yukihiro Watsuji; Akira Maruyama, both of Suwa, Japan

[73] Assignee: Seiko Epson Corporation, Tokyo, Japan

[*] Notice: The term of this patent shall not extend beyond the expiration date of Pat. No. 5,432,738.

[21] Appl. No.: 681,930

[22] Filed: Jul. 30, 1996

Related U.S. Application Data

[62] Division of Ser. No. 454,710, May 31, 1995, Pat. No. 5,574,686, which is a division of Ser. No. 187,311, Jan. 27, 1994, Pat. No. 5,432,738.

[30] Foreign Application Priority Data

Jan. 27, 1993 [JP] Japan ..................................... 5-11969

[51] Int. Cl.$^6$ .................................................. G11C 16/00
[52] U.S. Cl. .................. 365/185.27; 365/185.18; 365/185.24
[58] Field of Search ................... 365/185.27, 185.18, 365/185.24, 185.33, 185.23, 218

[56] References Cited

U.S. PATENT DOCUMENTS

| | | | |
|---|---|---|---|
| 5,022,002 | 6/1991 | Iwahashi | 365/185.23 |
| 5,031,149 | 7/1991 | Matsumoto et al. | 365/185.23 |
| 5,253,202 | 10/1993 | Bronner et al. | 365/230.06 |
| 5,297,104 | 3/1994 | Nakashima | 365/230.06 |
| 5,341,329 | 8/1994 | Takebuchi | 365/185.23 |
| 5,369,609 | 11/1994 | Wang et al. | 365/185.18 |
| 5,396,458 | 3/1995 | Shimoji | 365/185.02 |
| 5,398,204 | 3/1995 | Maruyama | 365/189.01 |

FOREIGN PATENT DOCUMENTS

| | | |
|---|---|---|
| 1-294297 | 11/1989 | Japan . |
| 4-3395 | 1/1992 | Japan . |

*Primary Examiner*—Tan T. Nguyen
*Attorney, Agent, or Firm*—Oliff & Berridge

[57] ABSTRACT

An object is to realize a nonvolatile semiconductor storage system which can prevent a false reading operation due to the overerasure, improve the lower limit of operation margin, lower the supply voltage and form a signal power supply. When each of memory transistors 1-4 is subjected to the reading operation, a negative voltage is applied to a non-selected word line WL2 from X-decoder 5 and negative voltage generating circuit 8 to prevent the false reading operation due to the overerasure. When each of the memory transistors 1-4 is subjected to the erasing operation, a negative voltage is applied to word lines WL1 and WL2 to reduce a high voltage to be applied to a source line SL. This can realize low voltage operation and single voltage power supply operation. By applying the negative voltage to the substrate of a memory transistor when it is subjected to the reading operation, the false reading operation due to the overerasure can be prevented.

4 Claims, 17 Drawing Sheets

FIG.2

| | WRITE SIGNAL | ERASE SIGNAL | READ SIGNAL | SL | BL1 | BL2 | WL1 | WL2 | SUB-STRATE |
|---|---|---|---|---|---|---|---|---|---|
| WRITING OPERATION | VDD | GND | GND | GND | VPP | OPEN | VPP | GND | GND |
| ERASING OPERATION | GND | VDD | GND | VPP | OPEN | OPEN | GND | GND | GND |
| READING OPERATION | GND | GND | VDD | GND | Vred | OPEN | VDD | VBB | GND |

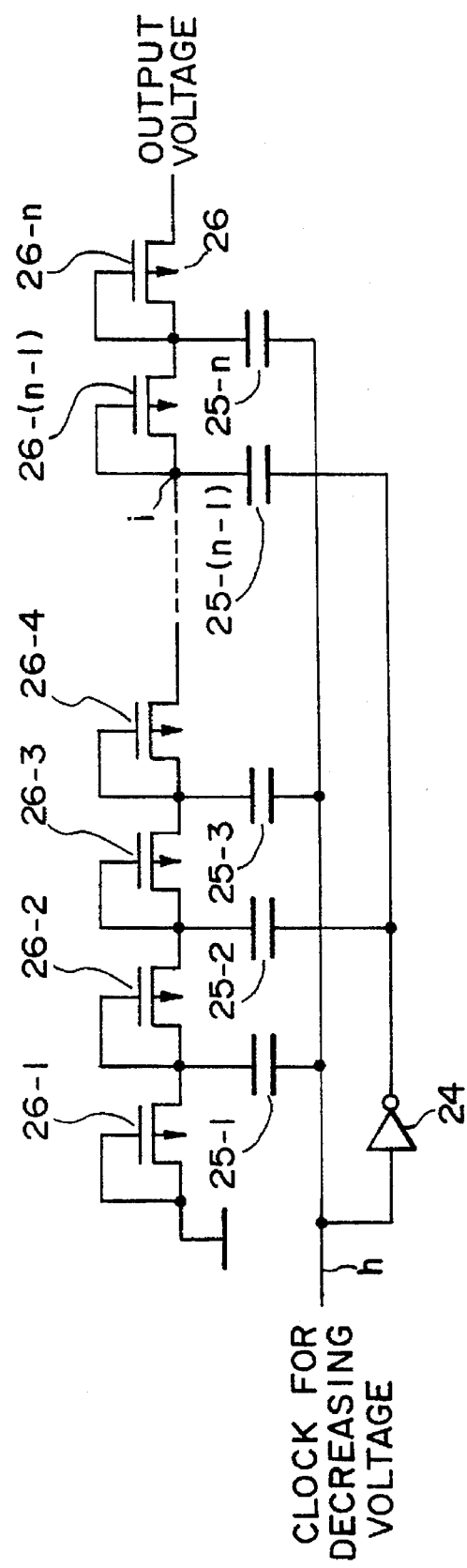

| WL | a | b | c | d | e |
|---|---|---|---|---|---|
| VPP | VPP | GND | GND | VPP→VPP | GND |
| VDD | VDD | GND | GND | VDD→VDD | GND |
| GND | VDD | GND | VDD | GND→GND | VDD |
| VBB | VDD | VBB | VDD | GND→VBB | VDD |

FIG. 5

| | WRITE SIGNAL | ERASE SIGNAL | READ SIGNAL | SL | BL1 | BL2 | WL1 | WL2 | SUB-STRATE |
|---|---|---|---|---|---|---|---|---|---|
| WRITING OPERATION | VDD | GND | GND | GND | VPP | OPEN | VPP | GND | GND |
| ERASING OPERATION | GND | VDD | GND | VDD | OPEN | OPEN | VBB | VBB | GND |
| READING OPERATION | GND | GND | VDD | GND | Vred | OPEN | VDD | VBB | GND |

FIG. 6

| | WRITE SIGNAL | ERASE SIGNAL | READ SIGNAL | SL | BL1 | BL2 | WL1 | WL2 | SUB-STRATE |
|---|---|---|---|---|---|---|---|---|---|
| WRITING OPERATION | VDD | GND | GND | GND | VDD | OPEN | VPP | GND | GND |
| ERASING OPERATION | GND | VDD | GND | VDD | OPEN | OPEN | VBB | VBB | GND |
| READING OPERATION | GND | GND | VDD | GND | Vred | OPEN | VDD | VBB | GND |

FIG. 10

| | WRITE SIGNAL | ERASE SIGNAL | READ SIGNAL | SL | BL1 | BL2 | WL1 | WL2 | SUB-STRATE |
|---|---|---|---|---|---|---|---|---|---|
| WRITING OPERATION | VDD | GND | GND | GND | VPP | OPEN | VPP | GND | GND |
| ERASING OPERATION | GND | VDD | GND | VPP | OPEN | OPEN | GND | GND | GND |
| READING OPERATION | GND | GND | VDD | GND | Vred | OPEN | VDD | GND | VBB |

| WL | f | g |
|---|---|---|
| VPP | GND | VPP |
| VDD | GND | VDD |
| GND | VDD | VDD |

FIG.14

| | WRITE SIGNAL | ERASE SIGNAL | READ SIGNAL | SL | BL1 | BL2 | WL1 | WL2 | SUB-STRATE |
|---|---|---|---|---|---|---|---|---|---|
| WRITING OPERATION | VDD | GND | GND | GND | VPP | OPEN | VPP | GND | GND |
| ERASING OPERATION | GND | VDD | GND | VPP | OPEN | OPEN | GND | GND | GND |
| READING OPERATION | GND | GND | VDD | Vx | Vx+Vred | OPEN | VDD | GND | GND |

FIG. 17
PRIOR ART

| | WRITE SIGNAL | ERASE SIGNAL | READ SIGNAL | SL | BL1 | BL2 | WL1 | WL2 | SUB-STRATE |
|---|---|---|---|---|---|---|---|---|---|
| WRITING OPERATION | VDD | GND | GND | GND | VPP | OPEN | VPP | GND | GND |
| ERASING OPERATION | GND | VDD | GND | VPP | OPEN | OPEN | GND | GND | GND |
| READING OPERATION | GND | GND | VDD | GND | Vred | OPEN | VDD | GND | GND |

NONVOLATILE SEMICONDUCTOR STORAGE SYSTEM

This is a division of application Ser. No. 08/454,710 filed May 31, 1995 now U.S. Pat. No. 5,574,686 which in turn is a Division of application Ser. No. 08/187,311 filed Jan. 27, 1994, now U.S. Pat. No. 5,432,738.

BACKGROUND OF THE INVENTION

1. Field of the Invention

The present invention relates to a nonvolatile semiconductor storage system and particularly to a flash (chip erase) type EEPROM circuit.

2. Description of the Related Art

In the accompanying drawings, FIG. 16 shows a flash type EEPROM circuit constructed in accordance with the prior art, which is illustrated as being of four-memory-transistor arrangement for simplicity.

As can be seen from FIG. 16, the flash EEPROM circuit comprises four memory transistors 1–4 which have source regions connected to a source line SL. The source line SL is connected to N- and P-channel transistors 11 and 12. The gate electrode of the N-channel transistor 11 receives an inverted erase signal while the gate electrode of the P-channel transistor 12 receives an inverted erase signal through an interface circuit 88. The interface circuit 88 functions to convert a fluctuation of input voltage at Vdd-GND into a fluctuation of output voltage at Vpp-GND.

The control gate electrodes of the memory transistors 1–4 are connected respectively to word line WL1 or WL2 while the drain regions of the memory transistors 1–4 are connected respectively to bit line BL1 or BL2.

Address signals are inputted to X- and Y-decoders 92 and 94 through an address buffer 90. In response to this, the X-decoder 92 generates word line signals to the word lines WL1 and WL2 while the Y-decoder 94 generates Y-decoder signals which are in turn outputted therefrom to a bit line control circuit 95 and a sense amplifier 96.

The bit line control circuit 95 is responsive to the Y-decoder signals to control the writing of data. More particularly, the bit line control circuit 95 writes data signals inputted through the data buffer 98 in the memory transistors 1–4 at addresses represented by the Y-decoder signals. The bit line control circuit 95 further controls the erasing and reading-out at the memory transistors 1–4.

On the other hand, the sense amplifier 96 reads out data stored in the memory transistors 1–4 using the Y-decoder signals as addresses. The read data are then outputted, as data signals, from the sense amplifier 96 to any external unit through the data buffer 98.

The operation of such a prior art system will now be described with reference to FIG. 17 which illustrates a truth table.

The writing operation will first be described. In the writing operation, erase signals are set at GND level to place the transistors 11 and 12 respectively in ON and OFF states. Thus, the source line SL is set at GND level, as shown in FIG. 17. When the writing operation is to be carried out for the memory transistor 1, the word and bit lines WL1 and BL1 are set at high voltage Vpp level (e.g. 10–12 volts) and WL2 and BL2 are set at Open level.

Under the above setting, the control gate electrode and drain region of only the memory transistor 1 are simultaneously placed at voltage of Vpp level to generate a channel current. As a result, hot electrons are produced at the drain region edge to inject electrons into the floating gate electrode. This causes the writing operation to be carried out for the memory transistor 1 so that data "0" will be stored therein. On the other hand, no channel current is produced in the other memory transistors 2–4 since the voltages at their control gate electrodes and drain regions are not simultaneously placed at Vpp level. Therefore, the writing operation will not be carried out for the memory transistors 2–4.

Next, the erasing operation will be described. In the erasing operation, erase signals are set at VDD level to turn the transistors 11 and 12 respectively off and on. The source line SL is thus set at Vpp level, as shown in FIG. 17. Under such a situation, further, the word lines WL1 and WL2 are set at GND level while the bit lines BL1 and BL2 are set at Open level.

Under the above setting, the source regions of the memory transistors 1–4 will be set at Vpp level while the floating gate electrodes thereof will be set at GND level. Therefore, a tunnel current will be generated between the floating gate electrode and the source region in each memory transistor. As a result, electrons will be released from the floating gate electrode to the source region to perform the erasing operation.

The reading operation will be described. In the reading operation, erase signals are set at GND level to turn the transistors 11 and 12 respectively on and off. The source line SL is thus set at GND level, as shown in FIG. 17. When data is to be read out from the memory transistor 1, the word lines WL1 is set at VDD level; the bit line BL1 is set at read-out level Vred which is a positive voltage (e.g. 1 volt); the word line WL2 is set at GND level; and the bit line BL2 is set at Open level.

Under the above setting, only the memory transistor 1 will have the control gate electrode of VDD level, the drain region of Vred level and the source region of GND level. When the writing operation has been carried out for the memory transistor 1 or when data "0" has been stored in the memory transistor 1, the drain current will not flow in the bit line BL1. On the contrary, when the writing operation has not been carried out for the memory transistor 1 or when data "1" has been stored in the memory transistor 1, the drain current will flow in the bit line BL1. Therefore, the stored data can be read out by detecting the drain current at the sense amplifier 96.

During the writing, erasing and reading operations, the X-decoder 92 and bit line control circuit 95 are controlled in operation by the write, read, and erase signals.

The prior art raises a problem in that the electrons are excessively released to make the threshold voltage of the memory transistor negative or to produce overerasing in the erasing operation.

It is now assumed that the memory transistor 3 has been overerased. It is also assumed that the writing operation has stored data "0" in the memory transistor 1. If data is read out from the memory transistor 1 under such a condition, any current ought not to flow through the bit line BL1 since the data "0" has been stored in the memory transistor 1. If the memory transistor 3 has been overerased, however, the drain current will flow at the bit line BL 1 even though the control gate electrode is set at GND level, as shown in FIG. 16. The drain current causes the sense amplifier 96 to be subjected to malfunction, leading to a wrong judgment that the data "1" has been stored in the memory transistor 1. As a result, the reading operation becomes false.

One of techniques for preventing such an overerasing is described in Japanese Patent Application Laid-Open No. Hei 1-294297. The technique detects an electric current flowing through a memory transistor during the erasing operation. If the current is detected, the transistor providing the erasing voltage is turned off to stop the erasing operation.

This technique is disadvantageous in that when a memory transistor is overerased, the erasing operation to the other memory transistors will also be stopped. This reduces the lower limit of operation margin in the other memory transistors.

Another technique for preventing the overerasing is a technique known as a verifying operation that is described in Japanese Patent Application Laid-Open No. Hei 4-3395, for example. The verifying operation monitors the threshold voltages in all the memory transistors at all times after the erasing operation. If the threshold voltages in all the memory transistors are equal to or lower than a preselected verify voltage, it is judged that a proper erasing operation has been carried out for each of the memory transistors. At this time, the subsequent erasing operations will be interrupted. On the other hand, if the threshold voltage in even only one memory transistor is higher than the verify voltage, it is judged that the erasing operation has not properly been carried out. After the erasing operation has again been performed, the verifying operation is again carried out. The verifying and erasing operations will be repeated until all the memory transistors are properly erased.

However, the verifying operation has such a problem that any memory transistor having a higher erasing speed or an increased shift of threshold voltage to the negative direction during the erasing operation cannot be prevented from being overerased.

Further, the flash type EEPROM circuit of the prior art has a problem in that the erasing operation requires more current flowing in the source line SL since it is of chip erase type or of block erase type. Therefore, the power supply ability of an internal voltage increasing circuit for supplying a high voltage VPP to the source line SL is limited to cause restriction of the capacity of the memory or supply of the high voltage VPP from the exterior of the semiconductor chip. These problems were large obstructions on low voltage operation and on single voltage power supply operation.

SUMMARY OF THE INVENTION

In order to overcome the aforementioned technical problems of the prior art, an object of the present invention is to provide a nonvolatile semiconductor storage system which can prevent any false read-out operation even if a memory transistor has been overerased and which can improve the lower limit of operational margin on the reading operation. Another object of the present invention is to provide a nonvolatile semiconductor storage system suitable for use in low voltage operation and the single voltage power supply operation.

To this end, the present invention provides a nonvolatile semiconductor storage system comprising a plurality of memory transistors arranged in a matrix, each of said memory transistors comprising a floating gate electrode, a control gate electrode, a source region and a drain region, the data writing and erasing operations of each of said memory transistors being carried out by injection and release of electrons relative to the floating gate electrode, the drain region, source region and control gate electrode thereof being connected respectively to a bit line, source line and word line, the improvement comprising an X-decoder for supplying a word line signal to said word line and a negative voltage generating circuit for supplying a negative supply voltage to said X-decoder, the word line signal of negative voltage being applied to said non-selected word line from said X-decoder and negative voltage generating circuit when said memory transistor is subjected to the reading operation.

According to the present invention, the word line signal of negative voltage is applied to the non-selected word line on the reading operation. Thus, the non-selected memory transistor will not be turned on even if it has been overerased. This can effectively prevent any false reading operation. As a result, the nonvolatile semiconductor storage system can be improved in reliability, yield, lower limit of operation margin, reading and low voltage operation. If the verifying operations are to be carried out, the number of verifying operations can be reduced.

It is desirable that on the erasing operation of memory transistor, the word line signal of negative voltage is applied to the word line from the X-decoder and negative voltage generating circuit.

This can lower the level of a high voltage to be applied to the source line on the erasing operation. As a result, the source region may not be formed into a double structure having layers of higher and lower concentrations of impurity. The memory area can be reduced with improved reliability. Furthermore, this enables low voltage operation and single voltage power supply operation. Furthermore, a circuit for generating the negative voltage on the erasing operation may be common to a circuit for generating the negative voltage on the reading operation, that is, a combination of the X-decoder with the negative voltage generating circuit. Consequently, the present invention does not require any additional hardware for generating the negative voltage on the erasing operation. In other words, the present invention has special advantages in that it can prevent any false reading and other operations due to the overerasure and lower the source line voltage on the erasing operation to decrease the memory area and to provide a single power supply without any additional hardware.

It is desirable that a bit line signal supplied to the bit line is generated by a bit line control circuit and that the bit line control circuit will not apply a high voltage to the bit line on the writing operation of the memory transistor.

Thus, the power supply to the bit line is not required to supply high voltage. As a result, the present invention provides the complete single power supply operation.

The nonvolatile semiconductor storage system of the present invention further comprises an erasing operation stopping circuit which detects a threshold voltage of a memory transistor in which a threshold voltage is most rapidly reduced, and stops the erasing operation when the detected threshold voltage is lower than a preset voltage, the negative voltage to be applied to the non-selected word line being lower than said preset voltage in the erasing operation stopping circuit.

In such a manner, the erasing operation can be stopped when the threshold voltage of the memory transistor in which the threshold voltage is most rapidly reduced is lower than the preset voltage. On the reading operation, a negative voltage lower than the preset voltage is applied to the non-selected word line. As a result, any false reading operation due to the overerasure can reliably be prevented. Considering the variability in the operational speed of the circuit, process fluctuation and other factors, a difference between the preset voltage and the negative voltage may be increased. This can more reliably prevent the false read-out due to the overerasure.

The present invention further provides a nonvolatile semiconductor storage system comprising a plurality of memory transistors arranged in a matrix, each of said memory transistors comprising a floating gate electrode, a control gate electrode, a source region and a drain region, the data writing and erasing operations of each of said memory transistors being carried out by injection and release of electrons relative to the floating gate electrode, the drain region, source region and control gate electrode thereof being connected respectively to a bit line, source line and word line, the improvement comprising a negative voltage generating circuit which applies a negative voltage to the substrates of the memory transistors on the reading operation.

According to the present invention, the threshold voltage of the memory transistor on the reading operation can be increased since the negative voltage is applied to the substrate of that memory transistor during the reading operation. If the level of the negative voltage is set to increase the threshold voltage of an overerased memory transistor to a level higher than GND level, the overerased memory transistor will not be turned on even though a signal of GND level is applied to the non-selected word line. Thus, any false read-out can effectively be prevented. As a result, the nonvolatile semiconductor storage system can be improved in reliability, yield, lower limit of operation margin, reading speed and low voltage operation. If the verifying operations are to be carried out, the number of verifying operations can be reduced.

It is desirable that the reading operation is carried out when the difference between the threshold voltage of a memory transistor in which the threshold voltage is most slowly reduced and the threshold voltage of another memory transistor in which the threshold voltage is most rapidly reduced decreases to a sufficiently small level.

Thus, the threshold voltage of a memory transistor can be increased after the range of distribution of the threshold voltage of that memory transistor has been reduced. Then, the reading operation to the memory transistor can be performed after that. This can prevent any false read-out due to the overerasure and improve the lower limit of operational margin. As a result, the nonvolatile semiconductor storage system can be improved in reliability, yield, lower limit of operational margin and reading speed and in reduction of supply voltage. If the verifying operations are to be carried out, the number of verifying operations can be reduced.

The present invention further provides a nonvolatile semiconductor storage system comprising a plurality of memory transistors arranged in a matrix, each of said memory transistors comprising a floating gate electrode, a control gate electrode, a source region and a drain region, the data writing and erasing operations of each of said memory transistors being carried out by injection and release of electrons relative to the floating gate electrode, the drain region, source region and control gate electrode thereof being connected respectively to a bit line, source line and word line, the improvement comprising a bit line control circuit for supplying a bit line signal to the bit line, a source line control circuit for supplying a source line signal to the source line and a positive voltage generating circuit connected to the source line control circuit for supplying a positive supply voltage to the source line control circuit, and when each of the memory transistors is being subjected to the reading operation, the source line control circuit and positive voltage generating circuit applying the source line signal of positive voltage to the source line and at the same time the bit line control circuit applying the bit line signal having a voltage higher than the positive voltage of said source line signal to the bit line.

According to the present invention, the threshold voltage of the memory transistor on the reading operation can be increased since the positive voltage is applied to the source line during the reading operation. If the level of the positive voltage is set to increase the threshold voltage of an overerased memory transistor to a level higher than GND level, the overerased memory transistor will not be turned on even though the GND level voltage is applied to the non-selected word line. Thus, any false read-out can effectively be prevented. As a result, the nonvolatile semiconductor storage system can be improved in reliability, yield, lower limit of operation margin, reading speed and low voltage operation. If the verifying operations are to be carried out, the number of verifying operations can be reduced.

In the present invention, the nonvolatile semiconductor storage system may further include a negative voltage generating circuit connected to the substrates of the memory transistors for supplying a negative supply voltage thereto. As each of the memory transistors is being subjected to the reading operation, the negative voltage generating circuit may apply a negative voltage to the substrate of the memory transistors while the source line signal of positive voltage is applied to the source line.

Thus, the positive and negative voltages will be applied respectively to the source line and memory transistor substrate during the reading operation relative to the memory transistor. Even though the levels of the negative and positive voltages do not have very large absolute value, the threshold voltage of the memory transistor being read out can be increased to a sufficiently high level. As a result, the false reading operation can more positively be prevented.

BRIEF DESCRIPTION OF THE DRAWINGS

FIG. 2 is a truth table illustrating the operation of the first embodiment.

FIG. 3 is a circuit diagram of a negative voltage circuit usable in the present invention.

FIG. 5 is a truth table illustrating the operation of the first embodiment when a negative voltage is applied to a word line being subjected to the erasing operation.

FIG. 6 is a truth table illustrating the operation of the first embodiment when a high voltage is not applied to a bit line being subjected to the writing operation.

FIG. 10 is a truth table illustrating the operation of the third embodiment.

FIG. 14 is a truth table illustrating the operation of the fourth embodiment.

FIG. 17 is a truth table illustrating the operation of the nonvolatile semiconductor system according to the prior art.

DETAILED DESCRIPTION OF THE PREFERRED EMBODIMENT

1. First Embodiment (1) Arrangement

Figure 1:
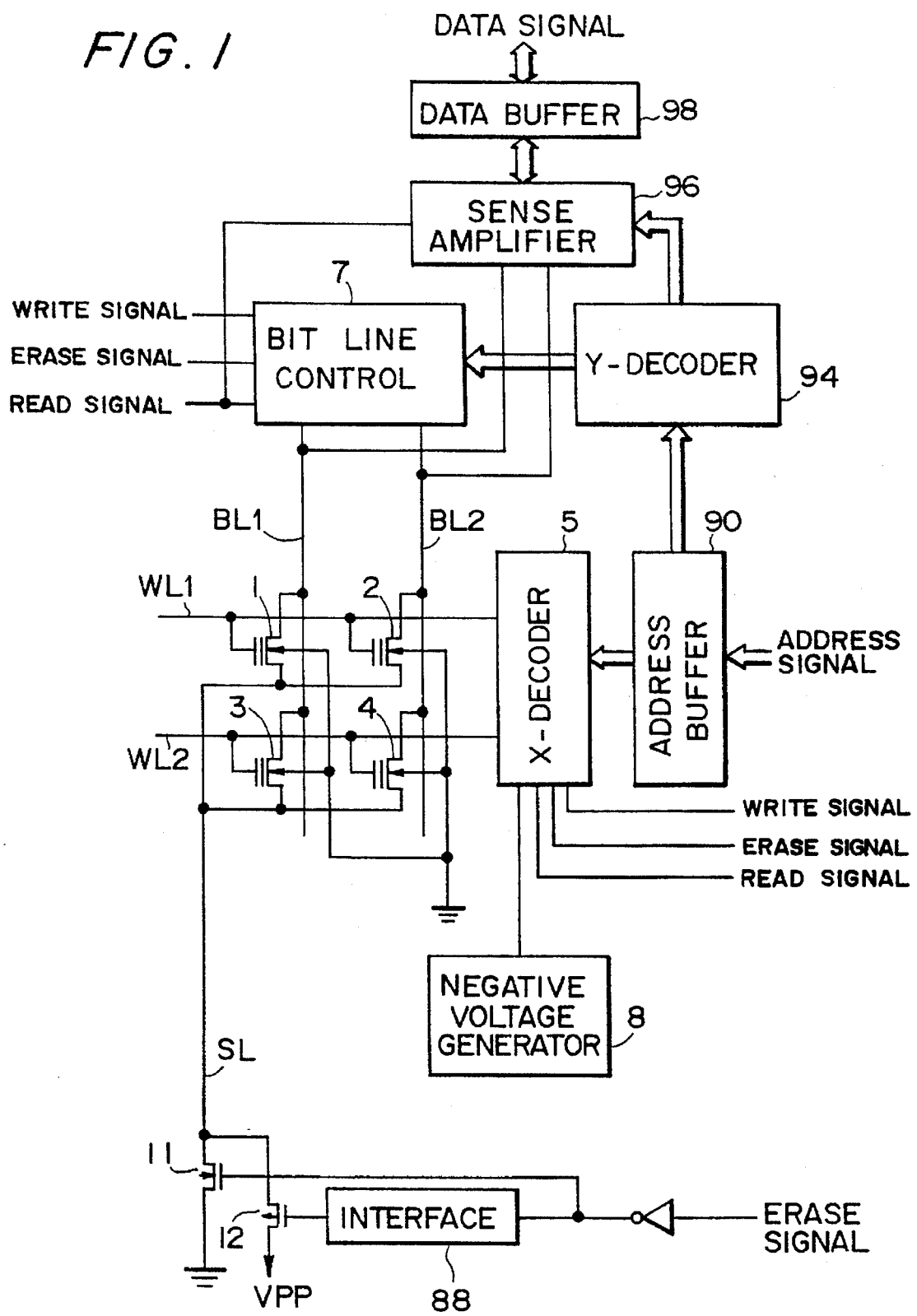
FIG. 1 is a circuit diagram of the first embodiment of a nonvolatile semiconductor storage system constructed in accordance with the present invention.

FIG. 1 is a circuit diagram of a flash type EEPROM which is the first embodiment of the present invention. For simplicity, it is assumed that the EEPROM is of a four-transistor type. In practice, the memory may comprise a desired number of memory transistors arranged in a matrix. In the following description, parts similar to those of the prior art shown in FIG. 16 are designated by similar reference numerals and will not further be described.

Figure 16:
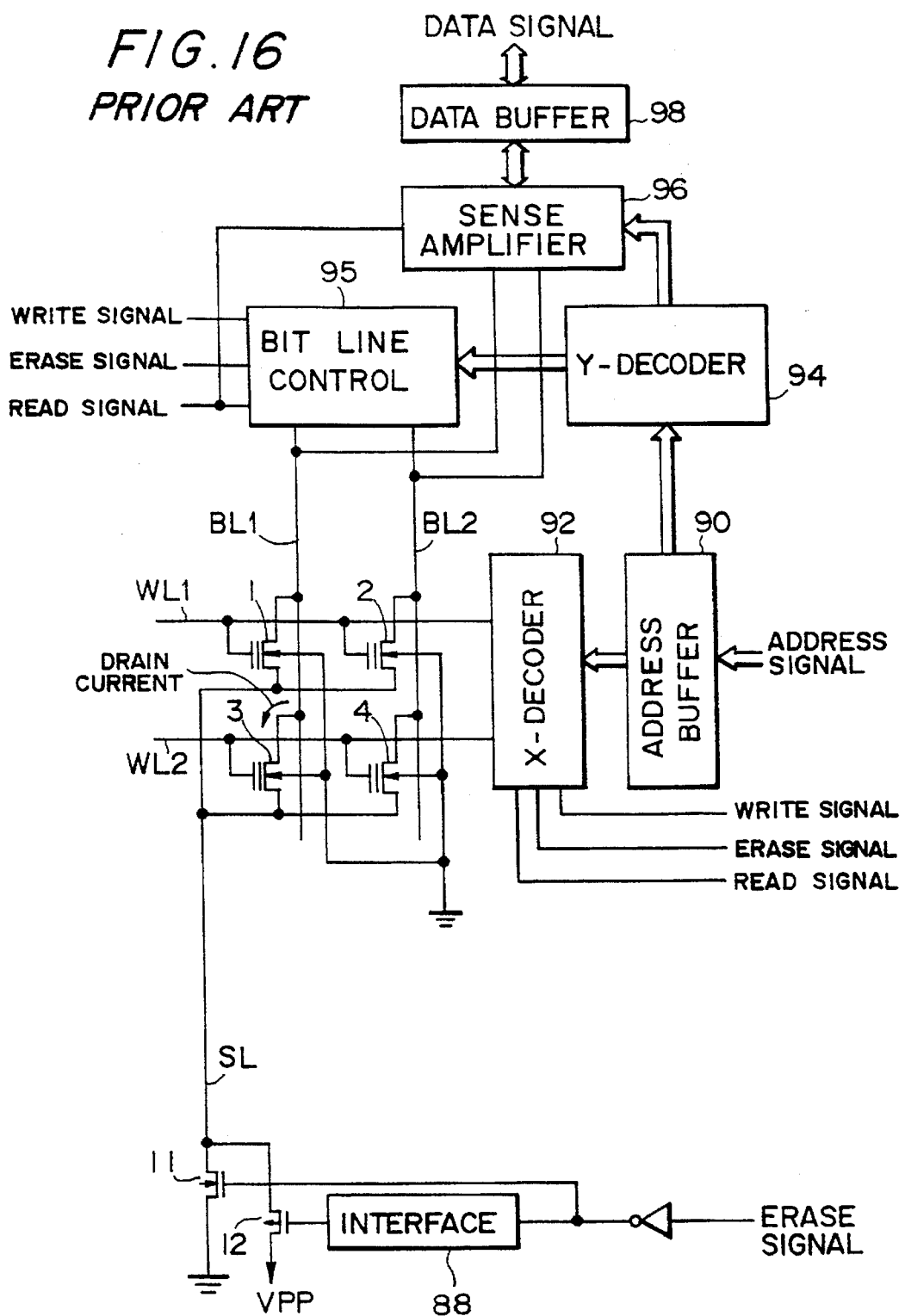
FIG. 16 is a circuit diagram of a nonvolatile semiconductor system constructed in accordance with the prior art.

As shown in FIG. 1, the first embodiment is different from the prior art of FIG. 16 only in that the first embodiment newly comprises a negative voltage generating circuit 8, resulting in a different structure of an X-decoder 5. The first embodiment can apply a negative voltage of VBB level to a non-selected word line when each memory transistor is being subjected to the reading operation.

Referring to FIG. 3, the negative voltage generating circuit comprises an inverter circuit 24, capacitors 25-1 to 25-n and P-channel transistors 26-1 to 26-n. When a clock for decreasing voltage is applied to the negative voltage generating circuit 8 at a node h, the circuit 8 can form a negative output voltage. The output voltage is supplied to the X-decoder 5 as a negative supply voltage. The output voltage is fetched from the other node such as node i to produce a plurality of different negative supply voltages.

Figures 4A, 4B:
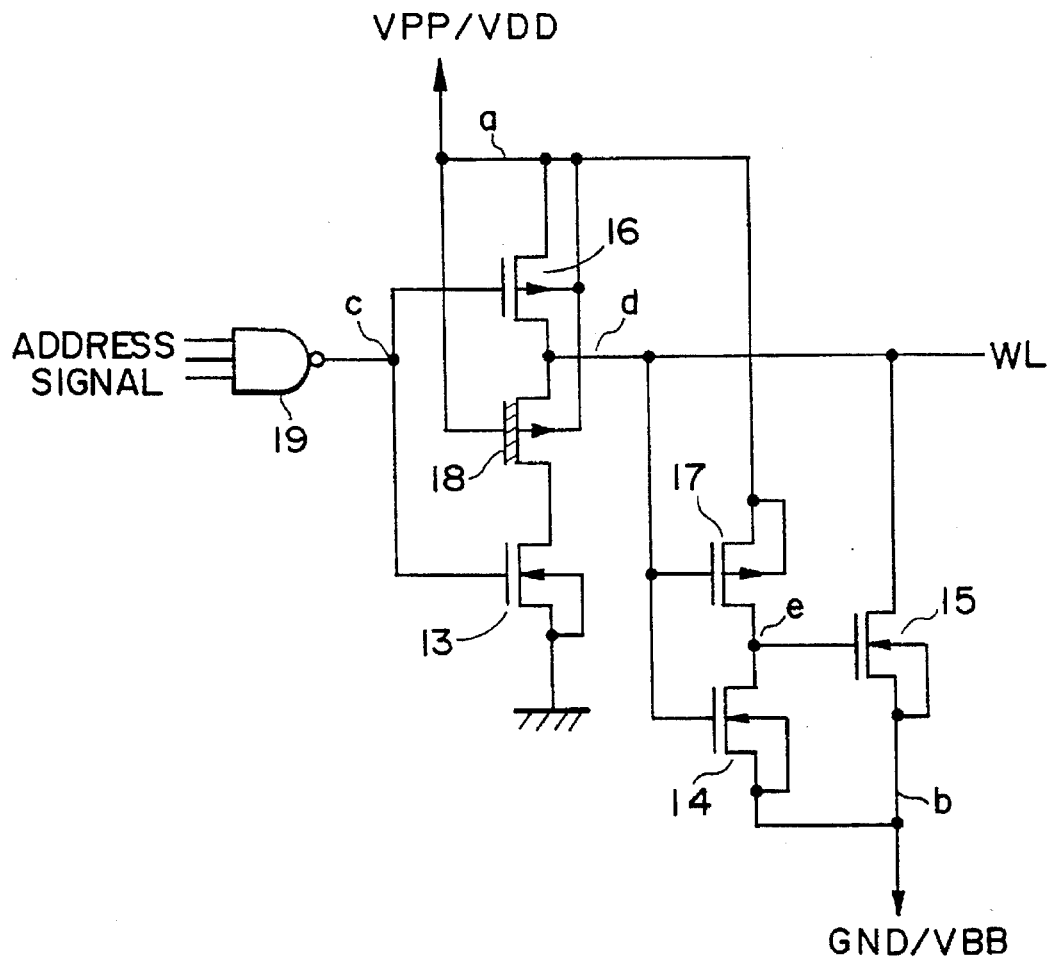
FIG. 4A is a circuit diagram of an X-decoder.
FIG. 4B is a truth table illustrating the operation of the X-decoder.

FIG. 4A shows an X-decoder 5 usable in the first embodiment. For simplicity, FIG. 4A only shows one of word lines WL in the X-decoder 5. As shown in FIG. 4A, the X-decoder 5 comprises N-channel transistors 13, 14 and 15, P-channel transistors 16, 17 and 18 and a NAND circuit 19.

The N-channel transistors 14 and 15 are located within a well separated from the other well in which the other N-channel transistors are disposed. Such an arrangement is provided because when a negative voltage VBB is applied to the source regions of the N-channel transistors 14 and 15, the potential of the other well is prevented from being changed by the application of such a negative voltage. The P-channel transistor 18 is of a depletion type which can prevent the negative voltage provided to the word line WL from flowing back to the N-channel transistor 13. The NAND circuit 19 decodes address signals. More particularly, when all the address signals are at VDD level, that is, when the word line WL is selected, the NAND circuit 19 will output a signal of GND level.

If the word line WL is not selected, the X-decoder 5 shown in FIG. 4A is adapted to output a word line signal of negative voltage. This is different from the X-decoder 92 of the prior art. The necessary negative supply voltage will be formed by the negative voltage generating circuit 8 shown in FIG. 3.

(2) Operation

The operation of the first embodiment will now be described.

The writing operation will first be described. In the writing operation, an erase signal is set at GND level while the source line SL is set at GND level, as shown in FIG. 2. When the writing operation is to be carried out to the memory transistor 1, word and bit lines WL1, BL1 are respectively set at high voltage VPP level: word line WL2 set at GND level: and bit line BL2 set at Open level.

Under such a setting, the voltages at the control gate electrode and drain region of only the memory transistor 1 are simultaneously at VPP level to inject electrons into the floating gate electrode. Only the memory transistor 1 is thus subjected to the writing operation such that data "0" will be stored in the memory transistor 1. On the other hand, the other memory transistor 2–4 will not be subjected to the writing operation since the voltages at their control gate electrodes and drain regions are not simultaneously at VPP level.

Next, the erasing operation will be described. In the erasing operation, the erase signal is set at VDD level while the source line SL is set at VPP level. Furthermore, the word lines WL1 and WL2 are set at GND level and the bit lines BL1 and BL2 are set at Open level.

Under such a setting, the source region and floating gate electrode in each of the memory transistors 1–4 are set at VPP and GND levels, respectively. Thus, electrons are released from the floating gate electrode to the source region so that the erasing operation will be carried out to all the memory transistors 1–4.

The reading operation will be described. In the reading operation, the erase signal is set at GND level and the source line SL is set at GND level, as shown in FIG. 2. When data is to be read out from the memory transistor 1, the word line WL1 is set at VDD level while the bit line BL1 is set at read-out level Vred. The other bit line BL2 is set at Open level.

In the prior art shown in FIG. 16, the non-selected word line, that is, WL2 is set at GND level, as shown by the truth table in FIG. 17. On the contrary, the first embodiment sets the non-selected word line WL2 at negative voltage VBB level, as shown by the truth table in FIG. 2. The negative voltage VBB will be formed by the X-decoder 5 and the negative voltage generating circuit 8 connected thereto.

Under such a setting, the control gate electrode, drain region and source region of only the memory transistor 1 will be set at VDD. Vred and GND levels, respectively. When the writing operation is performed to the memory transistor 1, that is, when data "0" is stored in the memory transistor 1, no drain current will flow in the bit line BL1. On the contrary, when the writing operation is not carried out to the memory transistor 1, that is, when data "1" is stored in the memory transistor 1, a drain current will flow in the bit line BL1. Therefore, the stored data can be read out by detecting the drain current at the sense amplifier 96.

Under the condition mentioned above, the non-selected word line WL2 is at negative voltage VBB level while the source line SL is at GND level, as shown by the truth table in FIG. 2. Thus, a voltage difference VGS between the gate and source of the memory transistor 3 becomes the negative voltage VBB level. It is now assumed that the memory transistor 3 is overerased to make its threshold voltage negative. It is also assumed that data "0" has been stored in the memory transistor 1 by the writing operation. If data is read out from the memory transistor 1 under such a condition, the prior art of FIG. 16 makes the voltage difference VGS between the gate and source of the memory transistor 3 zero volts so that it will be turned on. Thus, the drain current flow in the memory transistor 3 to raise a false reading operation. On the contrary, in the first embodiment, the memory transistor 3 will not be turned on even though it has been overerased, since the voltage difference VGS between the gate and source is at negative voltage VBB level. The drain current will not flow through the memory transistor 3. As a result, the false writing operation as mentioned above will not be carried out.

In order to suppress the false reading operation in the present embodiment, however, the threshold voltage in a memory transistor in which it is most rapidly reduced should not be reduced to a level equal to or lower than VBB volts by the overerasure. In the above embodiment, the drain current may flow through the memory transistor 3 to raise the false reading operation if the threshold voltage of the memory transistor is reduced to a level equal to or lower than VBB volt.

In such a manner, the first embodiment can prevent the false reading operation even if there is any overerased memory transistor. The first embodiment can also reduce the threshold voltage of a memory transistor being erased to a sufficiently low level since data can be read out from an overerased memory transistor. As a result, the lower limits of operation margin in all the memory transistors can greatly be increased to increase the reading speeds in the memory transistors.

(3) Operation of X-Decoder

The X-decoder 5 will be described in operation with reference to FIG. 4A. As will be apparent from the truth table of FIG. 2, the X-decoder 5 of the first embodiment must be so formed that signals of VPP, VDD, GND and negative voltage VBB levels can be outputted thereby. The outputting manner between the respective levels will be described with reference to the truth table of FIG. 4B.

When a signal of VPP level is to be outputted into the word line WL, nodes a and b are first set respectively at VPP and GND levels, as shown in FIG. 4B. When under such a state, a node c is set at GND level by the NAND circuit 19, the N-channel transistor 13 is turned off and the P-channel transistor 16 is turned on. This makes a node d VPP level. At this time, the N-channel transistor 14 is turned on and the P-channel transistor 17 is turned off. A node e is then made GND level. However, the voltage at the node d will not be changed since the N-channel transistor 15 is not turned on. Thus, a signal of VPP level will be outputted into the word line WL.

When a signal of VDD level is to be outputted into the word line WL, the nodes a and b are set at VDD and GND levels, respectively, as shown in FIG. 4B. When the node c is set at GND level by the NAND circuit 19 under such a state, the N-channel transistor 13 is turned off and the P-channel transistor 16 is turned on. The node d is made VDD level. At this time, the N-channel transistor 14 is turned on and the P-channel transistor 17 is turned off. Thus, the node e is made GND level. Since the N-channel transistor 15 is not turned on, however, the voltage at the node d will not be changed. Therefore, VDD level will be outputted into the word line WL.

When a signal of GND level is to be outputted into the word line WL, the nodes a and b are set respectively at VDD and GND levels, as shown in FIG. 4B. When under such a state, the node c is set at VDD level by the NAND circuit 19, the N-channel transistor 13 is turned on and the P-channel transistor 16 is turned off. This makes the node d GND level. At this time, the N-channel transistor 14 is turned off and the P-channel transistor 17 is turned on. The node e is then made VDD level. At this time, a signal of GND level will be outputted into the word line WL since the N-channel transistor 15 is turned on when the node e is at VDD level.

When a signal of VBB level is to be outputted into the word line WL, the node a is set at VDD level and the node b is set at VBB level which is produced by the negative voltage generating circuit 8, as shown in FIG. 4B. When VDD level is set at the node c by the NAND circuit 19 under such a state, the N-channel transistor 13 is turned on and the P-channel transistor 16 is turned off. This makes the node d GND level. When the node d is at GND level, the N-channel transistor 14 is turned off and the P-channel transistor 17 is turned on. This makes the node e VDD level. Then the N-channel transistor 15 is turned on and the voltage at the node d is pulled toward VBB level. Thus, a signal of negative voltage VBB will be outputted into the word line WL.

It is understood that the X-decoder 5 shown in FIG. 4A can output signal of all the levels of VPP, VDD, GND and negative voltage VBB. The settings of VPP, VDD, GND and VBB levels at the nodes a, b and c can be carried out by switching the write, erase, read-out and address signals from one to another.

(4) Low Voltage Operation

If the erasing operation is carried out in the flash EEPROM circuit of the prior art as shown in the truth table of FIG. 2, a very high voltage of VPP level (e.g., 10–12 volts) must be applied to the source line SL, that is, the source region of a memory transistor. This raises two problems as follows:

In order to increase the voltage applied to the source region on the erasing operation, the break down voltage of the source region must be set at a sufficiently high level. On the other hand, in order to prevent the endurance characteristic of the memory transistor from being degraded by a band-to-band tunneling current which is produced on the erasing operation, the concentration of impurity in the source region must be increased to reduce the band-to-band tunneling current. To meet these two requirements, the source region is required to be of a double-layer structure including layers of higher and lower impurity concentrations. However, such a technique raises a problem in that the memory transistors cannot be formed into a fine structure.

The second problem will be described. Normally, the flash EEPROM circuit erases the memory transistors in the chip erase or the block erase manner. In other words, all the memory transistors in a semiconductor chip or a block must be erased. Thus, much more current will flow in a power source for supplying the high voltage VPP. It is therefore difficult to supply the high voltage VPP level from a voltage increasing circuit included in the semiconductor chip. If the high voltage Vpp level is to be supplied from the voltage increasing circuit, the area of the voltage increasing circuit will be greatly increased. To supply the high voltage VPP, therefore, the flash EEPROM circuit of the prior art took a method of providing two external power supplies for supplying a normal voltage VDD and a high voltage VPP, that is, a two-source method. These external power supplies could not be united into a single voltage power supply unit by the prior art.

The first embodiment overcomes the above two problems of the prior art by applying the negative voltage VBB to all the word lines on the erasing operation of the memory transistors. In other words, the negative voltage VBB (e.g., −9 volts) can be applied to the word lines WL1 and WL2 on the erasing operation to make a voltage to be applied to the source line SL VDD level (e.g., 5 volts), as shown by the truth table in FIG. 5. Namely, the power supply connected to the P-channel transistor 12 can be made VDD level in FIG. 1. On the erasing operation, therefore, a voltage difference between the control gate electrode (VBB level, e.g., −9 volts) and the source region (VDD level, e.g., 5 volts) in the memory transistor may be equal to 14 volts, for example. Therefore, the erasing operation can be carried out by the use of tunneling current.

In this case, the negative voltage VBB is required to be produced by the negative voltage generating circuit 8 shown in FIG. 2. The negative voltage VBB is used to drive the word lines, that is, to drive the control gate electrode having very high input impedance. Therefore, the negative voltage generating circuit 8 for supplying the negative voltage VBB does not require high ability of power supply. Even if such a negative voltage is generated by the negative voltage generating circuit 8 in the interior of the semiconductor chip, the aforementioned problem as accompanying the prior art semiconductor chip in which the high voltage VPP would be generated by the voltage increasing circuit will not be raised in the first embodiment of the present invention. Furthermore, a circuit for generating the negative voltage on the erasing operation may be common to a circuit for generating the negative voltage on the reading operation, that is, a combination of the X-decoder 5 with the negative voltage generating circuit 8. Consequently, the first embodiment does not require any additional hardware for generating the negative voltage on the erasing operation.

As will be apparent from the foregoing, the first embodiment can effectively prevent any false reading operation due to the overerasure by applying the negative voltage to the non-selected word line on the reading operation by means of the X-decoder 5 and the negative voltage generating circuit 8. A combination of the X-decoder 5 with the negative voltage generating circuit 8 can be used also for applying the negative voltage to all the word lines on the erasing operation in order to lower the high voltage VPP level to be applied to the source line. This eliminates need of the aforementioned double-layer structure in all the memory transistors. Thus, the memory transistors can be reduced in area. If the high voltage VPP is lowered to the VDD level, the power can be supplied to the source line by using an external power supply, rather than the internal voltage increasing circuit in the semiconductor chip. This enables single voltage power supply operation in the semiconductor chip.

If the voltage VDD is supplied not only to the source line SL on the erasing operation, but also to the selected bit line BL1 on the writing operation, as shown by the truth table in FIG. 6, complete single voltage power supply operation can be realized. More particularly, the voltage VPP level can be supplied to the word lines through the internal voltage increasing circuit without very significant problem since the input impedance of the control gate electrode is very high. If the voltage of power supply to the selected bit line BL1 is set to VDD level on the writing operation, complete single voltage power supply operation can be realized. Even though the supply voltage to the selected bit line is equal to VDD on the writing operation, the reading operation will not greatly be influenced thereby.

2. Second Embodiment

Figure 7:
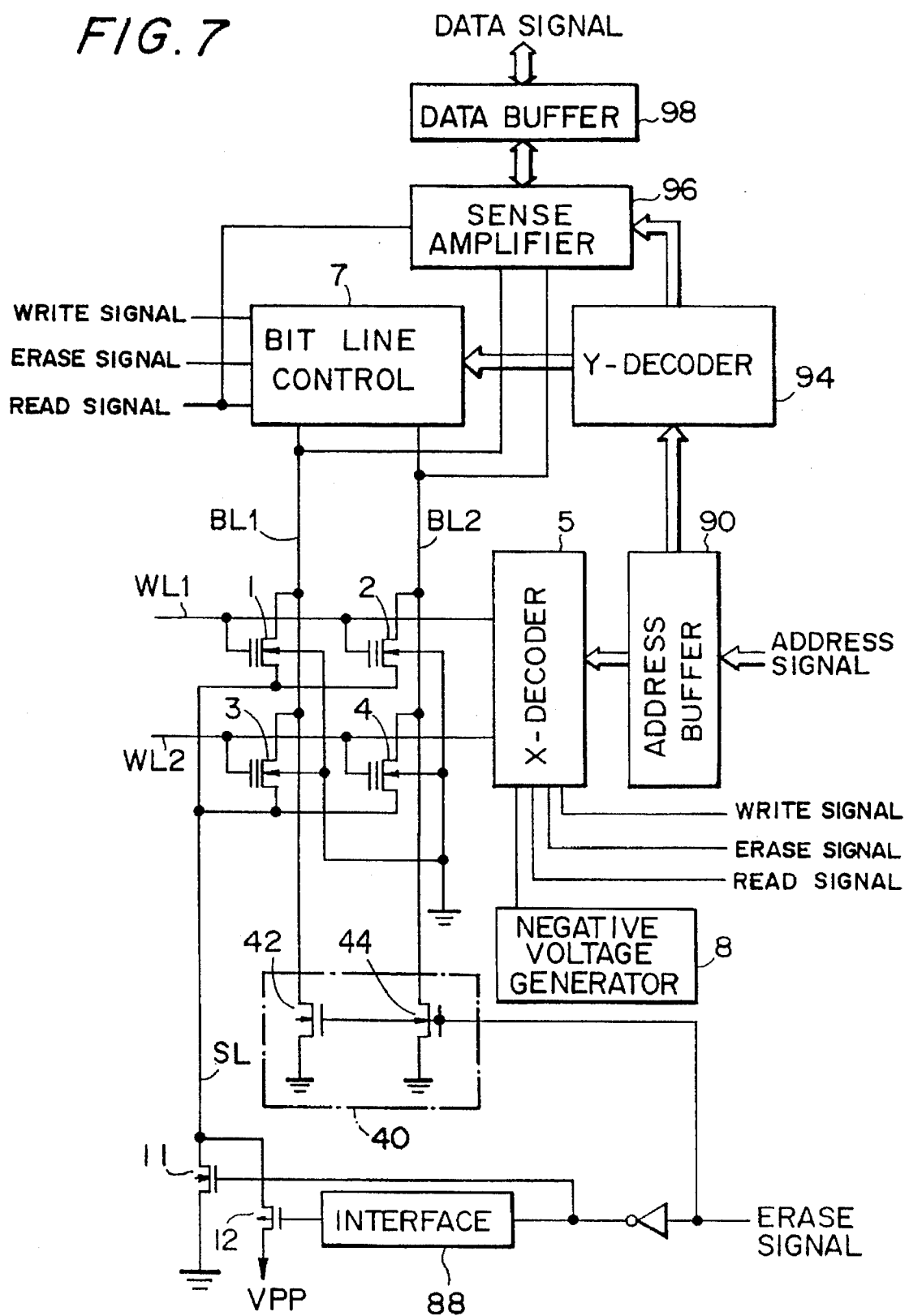
FIG. 7 is a circuit diagram of the second embodiment of a nonvolatile semiconductor storage system constructed in accordance with the present invention.

FIG. 7 shows the second embodiment of the present invention in which parts similar to those of the first embodiment shown in FIG. 1 are designated by similar reference numerals and will not further be described.

The second embodiment is different from the first embodiment only in that the second embodiment includes an erasing operation stopping circuit 40.

The erasing operation stopping circuit 40 comprises N-channel transistors 42 and 44. Each of the N-channel transistors 42 and 44 has a source region of GND level, a gate electrode receiving erase signals and a drain region connected to the bit line BL1 or BL2. In such an arrangement, the erasing operation stopping circuit 40 can detect the threshold voltage of a memory transistor in which it is most rapidly reduced. If the detected threshold voltage is lower than a preset voltage (i.e., zero volts in this case), the erasing operation will be stopped. The voltage VBB applied to the non-selected word line on the reading operation is set to be lower than the preset voltage (zero volts). Thus, any false reading operation due to the overerasure can reliably be prevented.

The operation of the second embodiment will be described with reference to FIG. 8 which shows waveforms of signals.

The writing operation is completely the same as that of the first embodiment shown in FIG. 2 and will not further be described.

Figure 8:
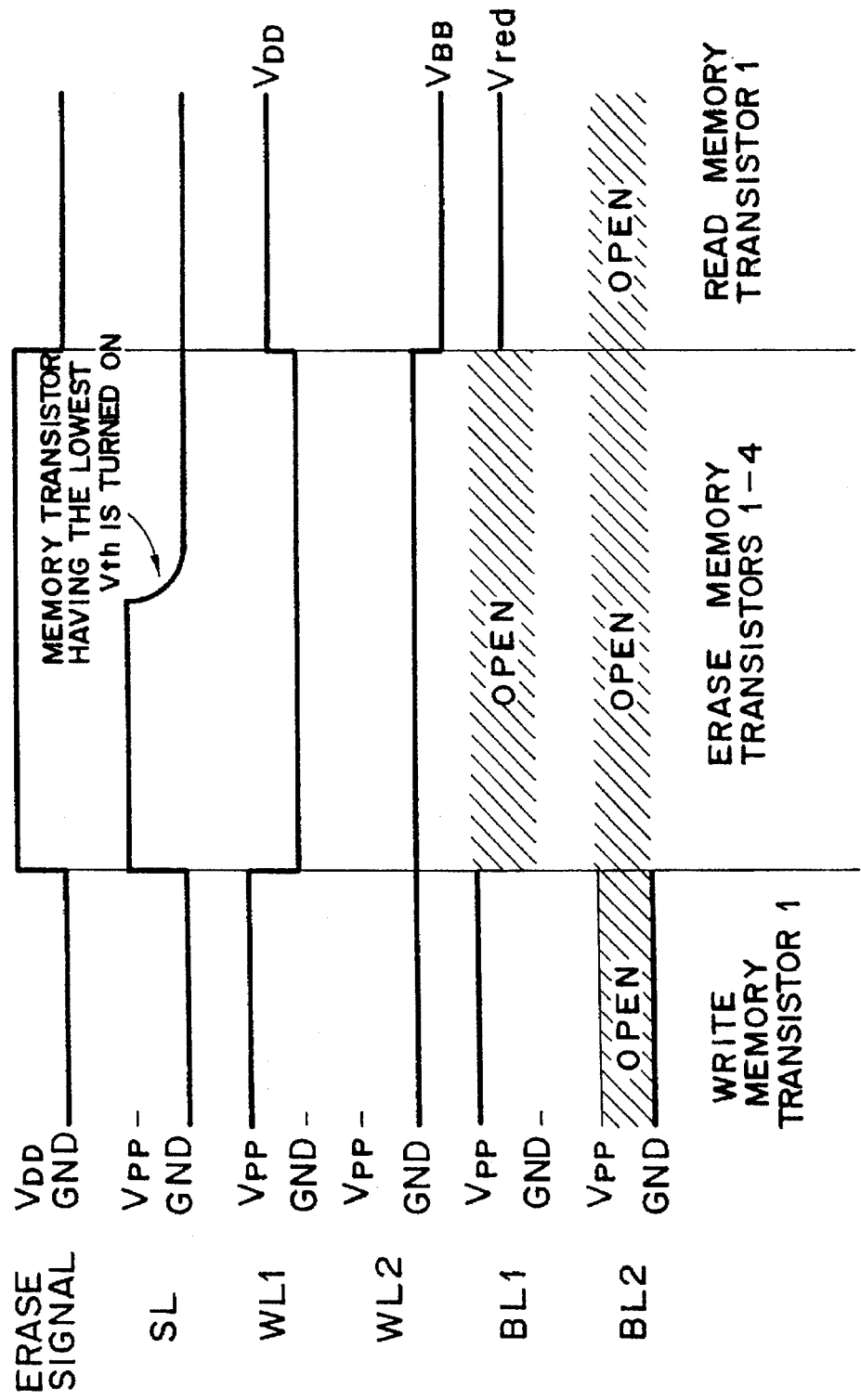
FIG. 8 is a view of signal waveforms illustrating the operation of the second embodiment.

When the erasing operation is to be carried out, the erase signal is set at VDD level and the source line SL is set at VPP level as shown in FIG. 8. Under such a state, further, the word lines WL1 and WL2 are set at GND level and the bit lines BL1 and BL2 are set at Open level.

Under such settings, the source region and floating gate electrode in each of the memory transistors 1–4 are set at VPP and GND levels, respectively. Thus, the erasing operation will be carried out to each of the memory transistors 1–4.

As the erasing operation proceeds, the threshold voltages in the memory transistors 1–4 decrease gradually. If the ability of power supply of the P-channel transistor 12 is set to be sufficiently smaller than the ability of power supply in the memory transistors 1–4 and N-channel transistors 42 and 44 and when one of the memory transistors 1–4 in which the threshold voltage thereof is most rapidly lowered is turned on, the voltage at the source line SL will be pulled down toward GND level through the N-channel transistor 42 or 44, as shown in FIG. 8. As a result, the voltage at the source line SL is further lowered. On reduction of the voltage at the source line SL, the tunneling current between the floating gate electrode and the source region in each of the memory transistors 1–4 is also reduced until the erasing operation is stopped.

In the second embodiment, on the erasing operation, the bit lines BL1 and BL2 are set at GND level and the word lines WL1 and WL 2 are also set at GND level. If the memory transistor in which the threshold voltage is most rapidly lowered by the erasing operation is turned on as described, the source line SL is pulled down toward GND level to stop the erasing operation. It is therefore ensured that the threshold voltages of the memory transistors 1–4 become equal to or higher than zero when the erasing operation is stopped. Even considering variability in the operational speed of the erasing operation stopping circuit 40 or other circuit, process fluctuation and other factors, it is further ensured that the threshold voltages of the memory transistors 1–4 may be equal to or higher than −1 volts, for example.

The reading operation will be carried out after the erasing operation has been stopped. For such a purpose, the erase signal and source line SL are set at GND level, as shown in FIG. 8. If it is wanted to read out data from the memory transistor 1, the word line WL1 and bit line BL1 are set at VDD and Vred levels, respectively. Further, the word line WL2 and bit line BL2 are set at negative voltage VBB level and Open levels, respectively.

Under the above settings, the writing operation can be carried out to the memory transistor 1. Since the control gate electrode and source region of the memory transistor 3 are set respectively at negative voltage VBB and GND levels, the voltage difference VGS between the gate and source of the memory transistor 3 is set at VBB volts. Therefore, the memory transistor 3 will not be turned on unless the threshold voltage of the memory transistor 3 becomes equal to or lower than VBB volts. As described, it is ensured that the threshold voltages of the memory transistors 1–4 become equal to or higher than zero volts when the erasing operation is stopped by the erasing operation stopping circuit 40. Even considering variability in the operational speed of the erasing operation stopping circuit 40 or other circuit, process fluctuation and other factors, it is further ensured that the threshold voltages of the memory transistors 1–4 may be equal to or higher than −1 volts, for example. If the negative voltage VBB level is set to be lower than zero volts and preferably equal to or lower than −1 volts, the false reading operation due to the overerasure can reliably be prevented. In this connection, the first embodiment raises a problem in that if there is a memory transistor in which the threshold voltage is extremely rapidly lowered and becomes equal to or lower than VBB volts when the erasing operation is stopped, the false reading operation will be produced. On the contrary, the second embodiment ensures that the threshold voltage of any memory transistor will be equal to or lower than the preset voltage by the erasing operation stopping circuit 40. Since the reading operation is carried out to the memory transistor at a voltage equal to or lower than the preset voltage, the false reading operation can reliably be prevented.

Although the second embodiment has been described as to the case that the threshold voltage used on the erasing operation stopping step is set to be equal to zero volts, the present invention is not limited to such a threshold voltage, but may be applied to all the set voltages. Further, the level of the negative voltage VBB may be set at any suitable level so long as it is lower than the present voltage.

3. Third Embodiment

Figure 9:
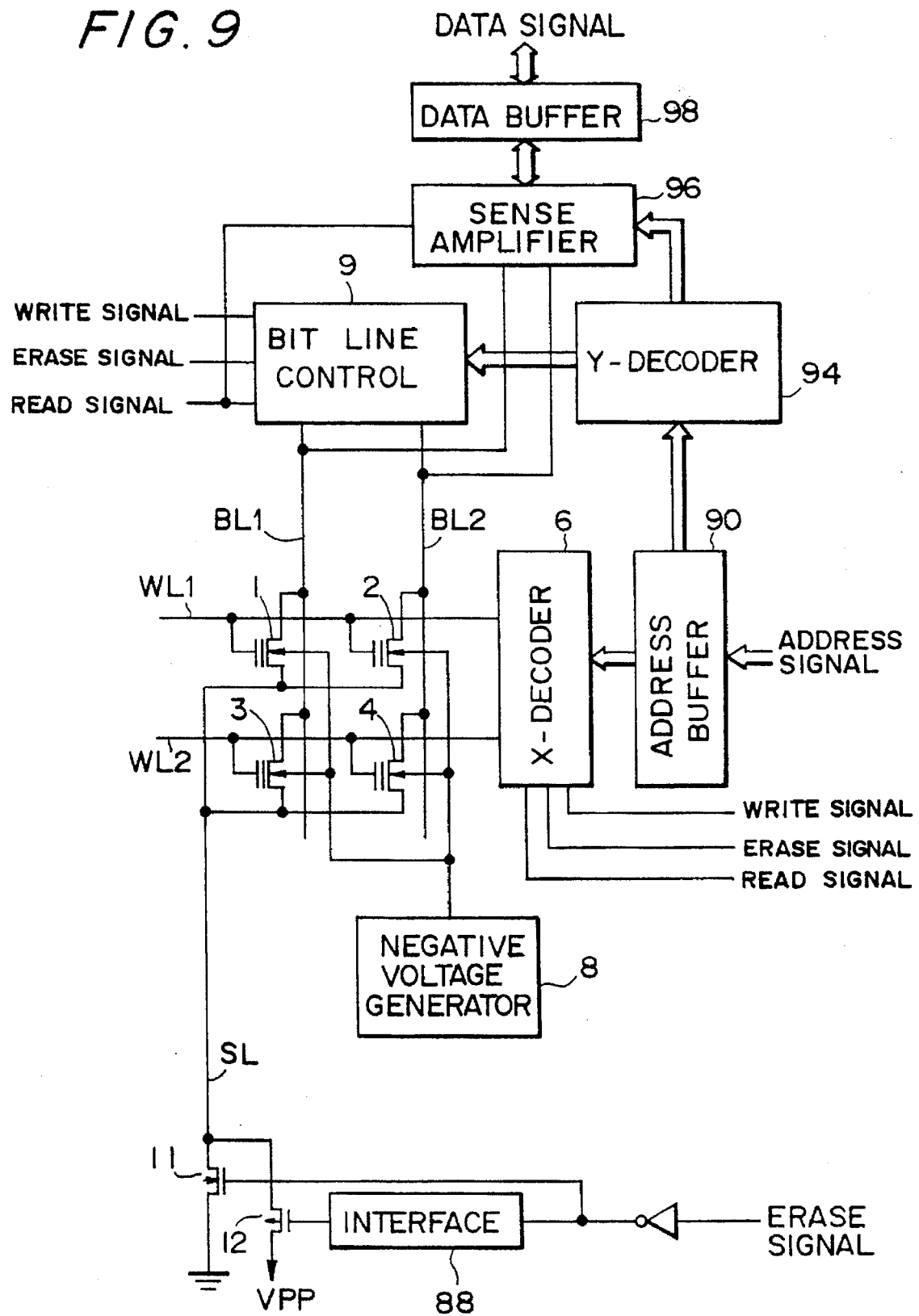
FIG. 9 is a circuit diagram of the third embodiment of a nonvolatile semiconductor storage system constructed in accordance with the present invention.

FIG. 9 shows the third embodiment of the present invention in which parts similar to those of the first embodiment shown in FIG. 1 are designated by similar reference numerals and will not further be described.

The third embodiment is different from the first embodiment only in that the negative voltage generating circuit 8 is connected to the substrates of the memory transistors 1–4, but not to the X-decoder. The third embodiment also comprises an X-decoder 6 which is different in structure from the X-decoder 5 of the first embodiment. The other parts are similar to those of the first embodiment.

In the third embodiment, on the reading operation, the negative voltage generating circuit 8 applies a negative voltage to the substrates of the memory transistors 1–4. Thus, the threshold voltage Vth in each of the memory transistors 1–4 increases. This can prevent any false reading operation.

Figures 11A, 11B:
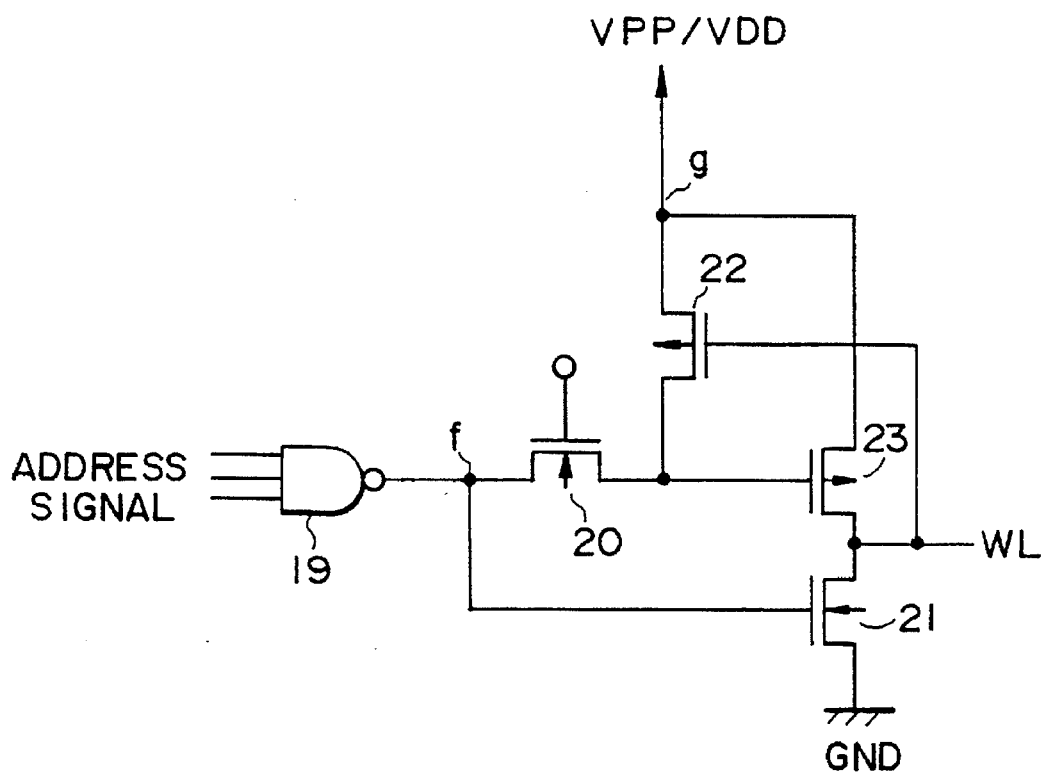
FIG. 11A is a circuit diagram of an X-decoder.
FIG. 11B is a truth table illustrating the operation of the X-decoder.

FIG. 11A shows an X-decoder 6 usable in the third embodiment. As shown in FIG. 11A, the X-decoder 6 comprises a NAND circuit 19, N-channel transistors 20, 21 and P-channel transistors 22, 23. In such an arrangement, the X-decoder 6 can apply a voltage of VPP, VDD or GND level to the word line WL. The N-channel transistor 20 is provided to prevent the high voltage from flowing back toward a node f when a signal of VPP level is outputted to the word line WL.

The third embodiment will now be described in operation with reference to the truth table shown in FIG. 10.

The writing and erasing operations are completely the same as those of the first embodiment shown in FIG. 2 and will not further be described.

The reading operation will be described below. When the reading operation is to be carried out, the erase signal and source line SL are set at GND level, as shown in FIG. 8. If it is wanted to read out data from the memory transistor 1, the word line WL1 and bit line BL1 are set at VDD and Vred levels, respectively. The word line WL2 and bit line BL2 are also set at GND and Open levels, respectively. Further, each substrate of the memory transistors 1 to 4 is set at negative voltage VBB level by the negative voltage generating circuit 8.

Under such settings, the memory transistor 1 will be able to be subjected to the reading operation. In this case, the control gate electrode and source region of the memory transistor 3 have been set at GND level. If the memory transistor 3 has been overerased so that the threshold voltage thereof is equal to or lower than zero volts, the memory transistor 3 will be turned on to create a false reading operation. In the third embodiment, however, the threshold voltage of the memory transistor 3 will be increased since the substrate thereof has been set at negative voltage VBB level as described.

$$Vth = |Vth0 + \gamma\{(|VSB| + 2|\psi a|)^{1/2} - (2|\psi a|)^{1/2}\}$$

where Vth0 is a threshold voltage at VSB=0 (V); ψa is a bulk potential; and VSB is a voltage between the source and the substrate (bulk).

In the above formula of threshold voltage, the absolute value of |VSB| is larger than zero (V) to increase the threshold voltage Vth since the voltage of the substrate is at negative voltage VSB level (while the source region is at GND level). Even if the memory transistor 3 has been overerased, it will not be turned on if the negative voltage VBB level is set so that the threshold voltage Vth is higher than zero volts. As a result, the drain current will not flow through the memory transistor 3 and the false reading operation will be prevented.

The X-decoder 6 shown in FIG. 11A will briefly be described in operation with reference to a truth table shown in FIG. 11B.

The X-decoder 6 is adapted to output signals of VPP, VDD and GND levels to the word line WL.

When it is wanted to output a signal of VPP level to the word line WL, a node g is first set at VPP level, as shown in FIG. 11B. If a node f is set at GND level by the NAND circuit 19 under such a state, the N-channel transistor 21 is turned off and the P-channel transistor 23 is turned on. Thus, a signal of VPP level will be outputted to the word line WL.

When it is wanted to output a signal of VDD level to the word line WL, the node g is set at VDD level. If the node f is set at GND level under such a state, the N-channel transistor 21 is turned off and the P-channel transistor 23 is turned on. Thus, a signal of VDD level will be outputted to the word line WL.

When it is wanted to output a signal of GND level to the word line WL, the node g is set at VDD level. If the node f is set at VDD level under such a condition, the N-channel transistor 21 is turned on and the P-channel transistor 23 is turned off. Thus, a signal of GND level will be outputted to the word line WL.

In the third embodiment, the overerasure is avoided by applying the negative voltage of VBB level to the substrate of a memory transistor, as described. If the negative voltage is applied to the substrate on the reading operation after the erasing operation has sufficiently been performed to lower the threshold voltage of that memory transistor to a sufficiently low level, the lower limit of operation margin can greatly be increased. This will be apparent from the characteristic curves shown in FIG. 12.

Figure 12:
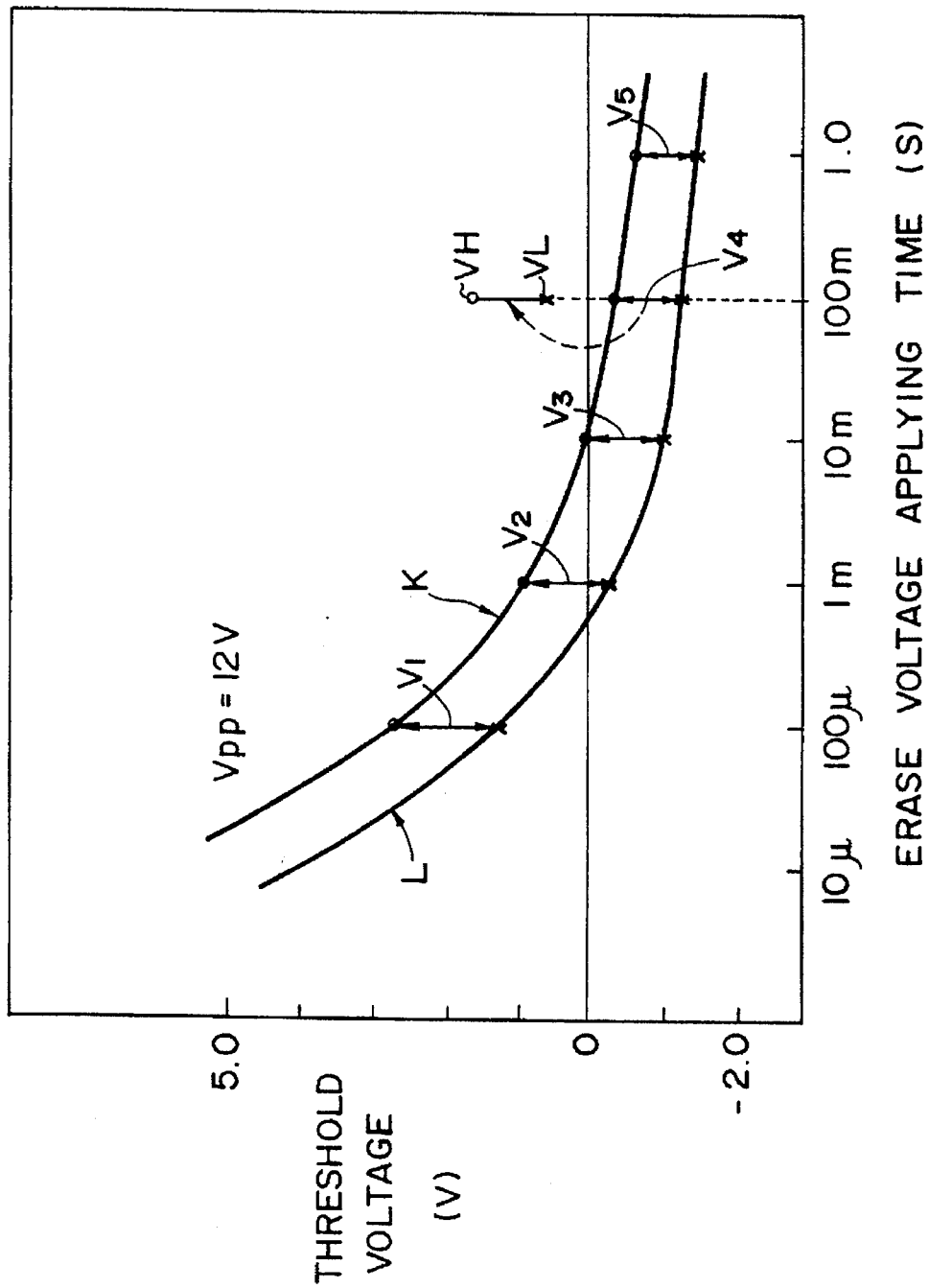
FIG. 12 is a graph illustrating the characteristic curves of the threshold voltage relative to the erasing voltage applying time.

FIG. 12 shows the characteristic curves in connection with reduction of the threshold voltage relative to the erasing voltage applying time on the erasing operation. A characteristic curve K shows the characteristic of a memory transistor in which the threshold voltage is most slowly lowered. This memory transistor will be called "slowly erased memory transistor". A characteristic curve L shows the characteristic of a memory transistor in which the threshold voltage is most rapidly reduced. This memory transistor will be called "rapidly erased memory transistor". As shown in FIG. 12, the rate of reduction in the threshold voltage is gradually decreased to converge on a given value as the erasing voltage applying time increases. The rapidly erased memory transistor will be converged on the given value more rapidly than the slowly erased memory transistor. As the erasing voltage applying time increases, therefore, a difference between the threshold voltages of the slowly and rapidly erased memory transistors gradually decreases.

It is now assumed in FIG. 12 that the threshold voltage difference is V1 when the erasing voltage applying time is 100 μsec. and that the threshold voltage difference is V4 when the erasing voltage applying time is 100 msec. As shown in FIG. 12, the value V1 is about 1.5 volts and the value V4 is about 0.8 volts. Namely, as the erasing operation proceeds, the threshold voltage difference decreases. This means that the range of distribution in threshold voltage between the memory transistors decreases by performing the erasing operation to a sufficient level. If the substrate is set at VBB level to perform the reading operation after the erasing operation has sufficiently been carried out to reduce the threshold voltage difference or the range of distribution in the threshold voltage to a sufficiently low level, the lower limit of operation margin can greatly be improved.

After the erasing operation has been carried out for time of 100 msec. in FIG. 12, the substrate is set at VBB level and the threshold voltage of the memory transistor is increased by about 2.0 volts. Thus, the threshold voltage of the rapidly erased memory transistor becomes equal to VL (about 0.6 volts) which is a positive value. This ensures to prevent a false reading operation. On the other hand, the threshold voltage of the slowly erased memory transistor becomes VH (about 1.8 volts). Therefore, a sufficient lower limit of operation margin can be obtained. This enables the reading operation to be performed more stably at higher speed and can provide a flash EEPROM circuit which is suitable for use in low voltage operation.

In FIG. 12, a region in which the erasing voltage applying time ranges between 100 msec. and 1.0 sec. is one that the amount of the threshold voltage Vth varying relative to the erasing voltage applying time t, that is, ΔVth/Δt is very small. In this region, therefore, the threshold voltage Vth can be very easily controlled.

4. Fourth Embodiment

Figure 13:
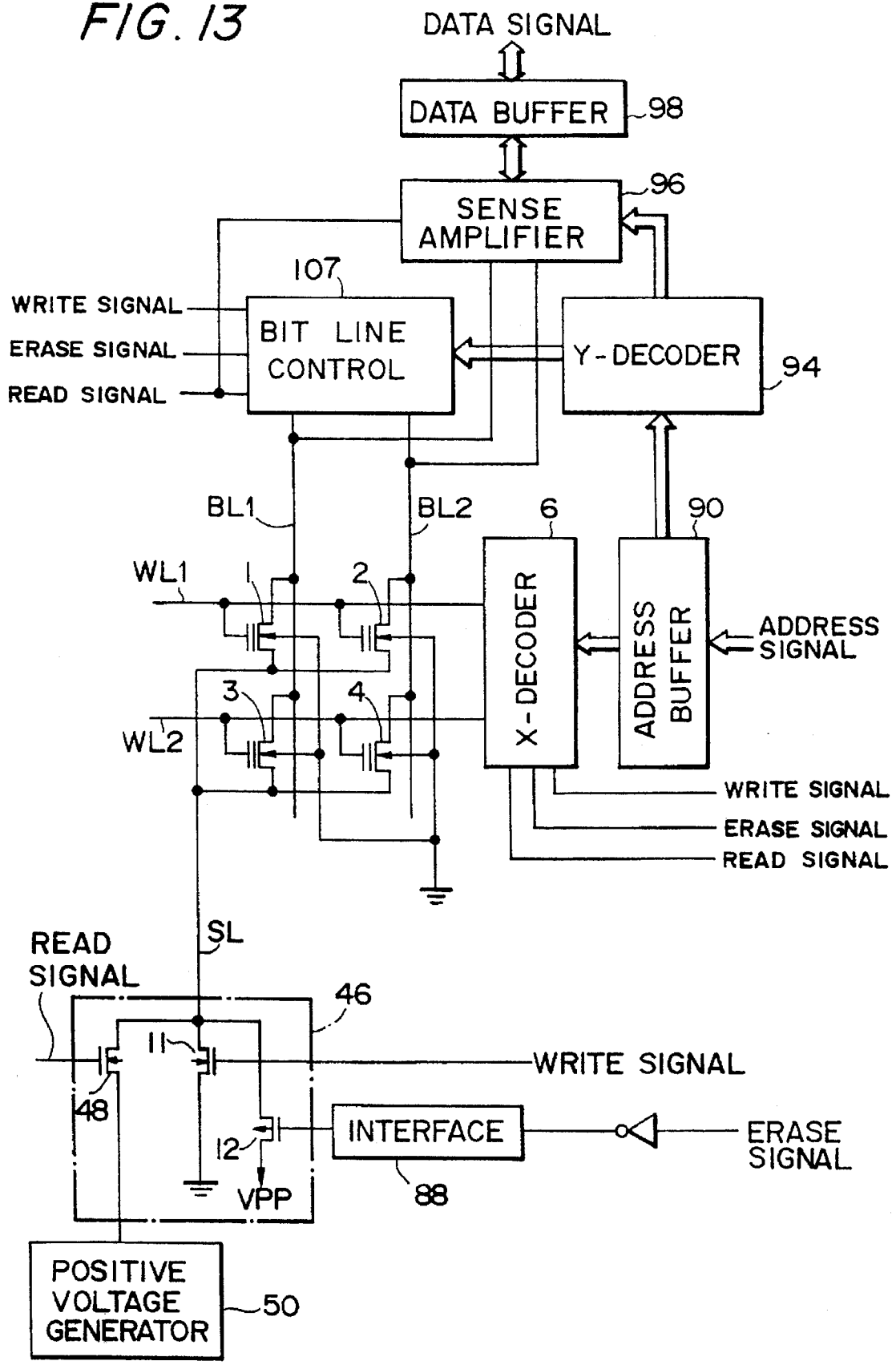
FIG. 13 is a circuit diagram of the fourth embodiment of a nonvolatile semiconductor storage system constructed in accordance with the present invention.

FIG. 13 shows the fourth embodiment of the present invention in which parts similar to those of the third embodiment shown in FIG. 9 are designated by similar reference numerals and will not be further described.

The fourth embodiment is different from the third embodiment in that the fourth embodiment comprises a source line control circuit 46 and a positive voltage generating circuit 50 connected thereto. The fourth embodiment is also different from the third embodiment in that the bit line control circuit 107 in the fourth embodiment is different in structure from that of the third embodiment and that the substrates of the memory transistors are set at GND level.

In the fourth embodiment, during the reading operation, a positive voltage of VX level is applied to the source line SL by the source line control circuit 46 and positive voltage generating circuit 50. By applying the positive voltage to the source regions of the memory transistors 1–4 in such a manner, the threshold voltages Vth of the memory transistors 1–4 can be increased to prevent the false reading operation. At this time, a voltage of (VX+Vred) level is applied to the selected bit line BL1 by the bit line control circuit 107.

The source line control circuit 46 comprises N-channel transistors 11, 48 and a P-channel transistor 12. The N-channel transistor 11 has its source region of GND level, with the gate electrode thereof receiving a write signal. The source region of the P-channel transistor 12 is at VPP level while the gate electrode thereof receives an inverted erase signal through an interface circuit 88. The source region of the N-channel transistor 48 is connected to the positive voltage generating circuit 50. The gate electrode of the N-channel transistor 48 is connected to a read signal. The source line SL will be set at GND level on the writing operation, at VPP level on the erasing operation and at positive voltage VX level on the reading operation by the source line control circuit 46 of such an arrangement.

Figure 15A:
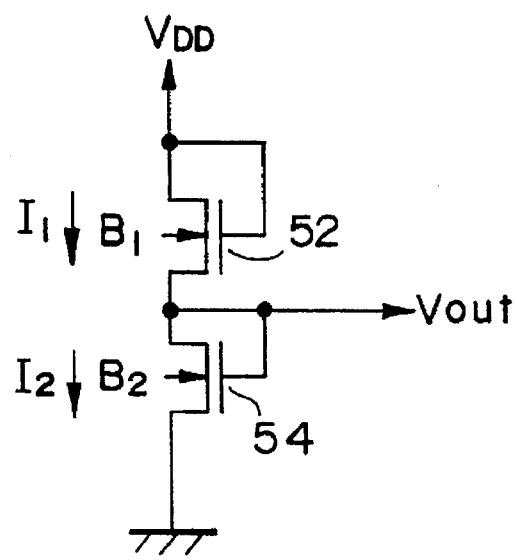
FIGS. 15A and 15B are circuit diagrams exemplifying positive voltage generating circuits usable in the present invention.
Figure 15B:
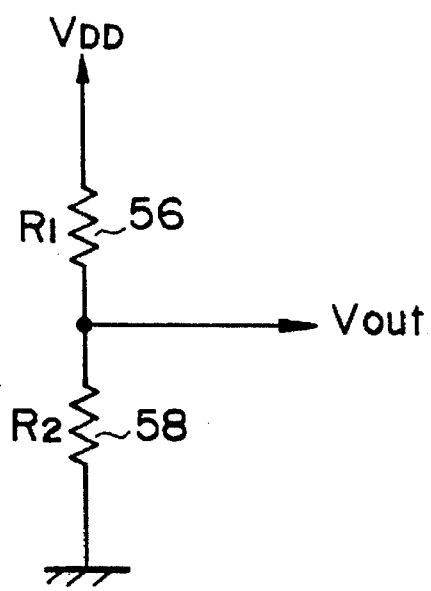

FIGS. 15A and 15B show a positive voltage generating circuit 50 usable in the fourth embodiment. A circuit shown in FIG. 15A comprises transistors 52 and 54 which are connected in series to each other so that they will function as diodes to output the positive voltage of VX level to VOUT. FIG. 15B shows a circuit for performing a resistive division of VDD level with resistors R1 and R2 to output the positive voltage of VX level to VOUT.

The fourth embodiment will now be described in operation with reference to a truth table shown in FIG. 14.

The writing and erasing operations are completely the same as those of the third embodiment shown in FIG. 10 and will not further be described.

When the reading operation is to be carried out, write and erase signals are set at GND level and read signal is set at VDD level as shown in FIG. 14. Thus, the N-channel transistor 11 and P-channel transistor 12 are turned off and the N-channel transistor 48 is turned on. The source line SL is then set at positive voltage VX level. The positive voltage VX is generated by the positive voltage generating circuit 50. When it is wanted to read out data from the memory transistor 1, the word and bit lines WL1, BL1 are set at VDD level and reading level (VX+Vred), respectively. The bit line BL1 is set at (VX+Vred) level to flow the drain current in the selected memory transistor 1 from the drain region to the source region. The positive voltage of (VX+Vred) level is generated by the bit line control unit 107. Further, the word and bit lines WL2, BL2 are set at GND and Open levels, respectively.

Under such settings, the reading operation can be carried out to the memory transistor 1. In this case, the control gate electrode and source region of the memory transistor 3 have been set at GND level. If the memory transistor 3 has been overerased to reduce the threshold voltage to a level equal to or lower than zero volts, the memory transistor 3 will be turned on to create a false reading operation. In the fourth embodiment, however, the threshold voltage of the memory transistor 3 will increase since the source region thereof has been set at positive voltage of VX level.

$$Vth=|VthO|+\gamma\{(|VSB|+2|\psi a|)^{1/2}-(2|\psi a|)^{1/2}\}$$

As will be apparent from the above formula of threshold voltage, the absolute value of |VSB| becomes higher than zero (V) to increase the threshold voltage Vth since the voltage at the source region is at positive voltage of VX level (while the substrate is at GND level). Even if the memory transistor 3 has been overerased, the memory transistor 3 will not be turned on if the positive voltage VX level is set so that the threshold voltage Vth becomes higher than zero volts. As a result, the drain current can be prevented from being created through the memory transistor 3 to avoid any false reading operation.

In the fourth embodiment, thus, the overerasure can be prevented by applying the positive voltage of VX level to the source region of a memory transistor on the reading operation. If the positive voltage is applied to the source region of the memory transistor on the reading operation after the erasing operation has sufficiently been performed to reduce the threshold voltage of the memory transistor to a sufficiently low level, the lower limit of operation margin can be greatly improved. This will be apparent from the characteristic curves shown in FIG. 12.

It is to be understood that the present invention is not limited to the aforementioned embodiments, but may be applied in various modified and changed forms without departing from the scope of the invention.

For example, the X-decoder, negative voltage generating circuit or positive voltage generating circuit in the first to fourth embodiments may be replaced by any suitable means. The negative or positive voltage generating circuits are not necessarily included within the semiconductor chip, but may be replaced by any external circuit for supplying negative or positive voltage.

Although the first to fourth embodiments of the present invention have been described as to VDD level of 5 volts, the VDD level may be set, for example, at 3 volts when the power supply voltage in the semiconductor chip is to be lowered.

The erasing operation stopping circuit of the second embodiment may be replaced by any other suitable erasing operation stopping means. For example, the erasing operation stopping means may be adapted to detect a current flowing in a bit line, the detected current being used to stop the erasing operation. Further, the erasing operation stopping circuit may be replaced by any suitable verifying means.

The present invention may be applied in a combined form of the first and third embodiments to perform the reading operation. More particularly, the reading operation may be carried out by setting the non-selected word line WL at VBB level and the substrate of the memory transistor at VBB level. Similarly, the second embodiment may be combined with the third embodiment; the first embodiment may be combined with the fourth embodiment; or the second embodiment may be combined with the fourth embodiment. With such combinations, the characteristics shown in FIG. 12 may be utilized to reduce the range of distribution in the threshold voltage while the false reading operation due to the overerasure can reliably be prevented.

Even if the third embodiment is combined with the fourth embodiment, that is, if the substrate of each of the memory transistors is set at negative voltage of VBB level and the source region of that memory transistor is set at positive voltage of VX level, the reading operation can be carried out. In such a combination, the threshold voltage of the memory transistor can sufficiently be increased on the reading operation even if the absolute values of the negative and positive voltages of VBB and VX levels are not very increased.

In addition to the selective writing and chip erase described in connection with the first to fourth embodiments, the present invention may easily be applied to the chip write and selective erase technique. Particularly, the latter technique is effective on providing a semiconductor chip with single voltage power supply operation.

We claim:

1. A nonvolatile semiconductor storage system comprising:

a plurality of memory transistors arranged in a matrix, each of said memory transistors comprising a floating gate electrode, a control gate electrode, a source region and a drain region, the data writing and erasing operations of memory transistors being carried out by injection and release of electrons relative to said floating gate electrode;

a plurality of bit lines, the drain region of each memory transistor being connected to one of said bit lines;

a source line, the source region of each memory transistor being connected to said source line;

a plurality of word lines, the control gate electrode of each memory transistor being connected to one of said word lines;

a negative voltage generating circuit for applying a negative voltage to the substrates of said memory transistors during a reading operation.

2. A nonvolatile semiconductor storage system as defined in claim 1, further comprising means for reducing the threshold voltage difference, during the erasing operation, between the threshold voltage of a memory transistor in which the threshold voltage is most slowly reduced and the threshold voltage of another memory transistor in which the threshold voltage is most rapidly reduced.

3. A nonvolatile semiconductor storage system as defined in claim 1, further comprising an x-decoder for applying a positive voltage to at least one word line of said plurality of word lines during a reading operation, the at least one word line connected to a memory transistor subjected to the reading operation and for applying a negative voltage to at least another of said plurality of word lines during the reading operation.

4. A nonvolatile semiconductor storage system as defined in claim 2, further comprising an x-decoder for applying a positive voltage to at least one word line of said plurality of word lines during a reading operation, the at least one word line connected to a memory transistor subjected to the reading operation and for applying a negative voltage to at least another of said plurality of word lines during the reading operation.

* * * * *